United States Patent
Yang et al.

(10) Patent No.: US 9,503,081 B2
(45) Date of Patent: Nov. 22, 2016

(54) RADIO FREQUENCY ANTENNA SWITCH

(71) Applicant: Huawei Technologies Co., Ltd., Shenzhen (CN)

(72) Inventors: Jinger Yang, Shanghai (CN); Yusong Chi, Shanghai (CN); Jinhan Fan, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 58 days.

(21) Appl. No.: 14/641,764

(22) Filed: Mar. 9, 2015

(65) Prior Publication Data

US 2015/0303982 A1  Oct. 22, 2015

(30) Foreign Application Priority Data

Apr. 22, 2014 (CN) .......................... 2014 1 0162731

(51) Int. Cl.
*H04B 1/46* (2006.01)
*H03K 17/693* (2006.01)
*H03K 17/10* (2006.01)
*H03K 17/14* (2006.01)

(52) U.S. Cl.
CPC .......... *H03K 17/693* (2013.01); *H03K 17/102* (2013.01); *H03K 17/145* (2013.01)

(58) Field of Classification Search
CPC .................................................. H03K 17/102
USPC ........................... 455/78, 82, 408; 307/303.2
See application file for complete search history.

(56) References Cited

U.S. PATENT DOCUMENTS

| 7,738,841 | B2 | 6/2010 | Ahn et al. |
| 2009/0073078 | A1 | 3/2009 | Ahn et al. |
| 2011/0025403 | A1 | 2/2011 | Cassia |
| 2012/0252384 | A1 | 10/2012 | Burgener et al. |
| 2014/0009211 | A1 | 1/2014 | Madan et al. |
| 2014/0009214 | A1 | 1/2014 | Altunkilic et al. |

FOREIGN PATENT DOCUMENTS

| CN | 101388682 A | 3/2009 |
| CN | 102355223 A | 2/2012 |
| CN | 102474249 A | 5/2012 |
| CN | 103227629 A | 7/2013 |
| CN | 103401531 A | 11/2013 |

OTHER PUBLICATIONS

Foreign Communication From a Counterpart Application, Chinese Application No. 201410162731.6, Chinese Office Action dated Jun. 15, 2016, 5 pages.
Lee, T., et al., "Modeling of SOI FET for RF Switch Applications," RTU2D-2, IEEE Radio Frequency Integrated Circuits Symposium, May 23-25, 2010, pp. 479-482.
Parthasarathy, S., et al., "RF SOI Switch FET Design and Modeling Tradeoffs for GSM Applications," 23rd International Conference on VLSI Design, IEEE Computer Society, Jan. 3-7, 2010, pp. 194-199.
Huang, F., et al., "A 0.5-μm CMOS T/R Switch for 900-MHz Wireless Applications," IEEE Journal of Solid-State Circuits, vol. 36, No. 3, Mar. 2001, pp. 486-492.
Numata, K., et al., "A High-Power-Handling GSM Switch IC with New Adaptive-Control-Voltage-Generator Circuit Scheme," MO2D-4, Photonic and Wireless Device Research Laboratories, NEC Corporation, Jun. 8-10, 2003, pp. 233-236.

*Primary Examiner* — Hsin-Chun Liao
(74) *Attorney, Agent, or Firm* — Conley Rose, P.C.

(57) ABSTRACT

A radio frequency antenna switch is provided that includes an antenna port, a radio frequency signal port, and at least one branch connected to the antenna port or the radio frequency signal port, where each branch includes multiple transistors which are connected in a stack manner; channel width to length ratios of a preset number of transistors in the multiple transistors progressively decrease in a direction away from the antenna port, where the preset number is less than or equal to the total number of the multiple transistors. With the radio frequency antenna switch, capacitances of the preset number of transistors close to the antenna port increase, and distributed voltages that these transistors close to an antenna end in an off state need to bear are reduced.

4 Claims, 8 Drawing Sheets

RADIO FREQUENCY ANTENNA SWITCH

CROSS-REFERENCE TO RELATED APPLICATION

This application claims priority to Chinese Patent Application No. 201410162731.6, filed on Apr. 22, 2014, which is hereby incorporated by reference in its entirety.

TECHNICAL FIELD

The present invention relates to the field of wireless communications technologies, and in particular, to a radio frequency antenna switch.

BACKGROUND

Wireless terminal devices, such as mobile phones, have gradually become an indispensable part in modern life, and currently, demands for wireless terminal devices that support multimode and multiband are becoming more obvious. In the wireless terminal devices, radio frequency paths of different frequency bands share a same antenna, and therefore, a multimode radio frequency antenna switch becomes an important part in a radio frequency front module of the wireless terminal devices.

A single-pole double-throw (SPDT) switch is used as an example to describe a structure of a commonly used radio frequency antenna switch. As shown in FIG. 1, FIG. 1 is a schematic diagram of a basic structure of an SPDT radio frequency antenna switch. The SPDT radio frequency antenna switch includes two paths, and each path includes a series branch (M1, M2) and a parallel branch (M3, M4). M1 to M4 are all transistor devices. A branch connecting a signal end and an antenna is a series branch, for example, M1 in the series branch is used to send a signal from a power amplifier (PA) to the antenna. A branch connecting the signal end and the ground is a parallel branch, for example, when M1 in the series branch is conducted, in order to send, to the antenna, a signal at a transmit end from a PA output end, M3 in the parallel branch at the transmit end and M2 in the series branch at a receive end should be in an off state, while M4 in the parallel branch at the receive end should be in an on state, so as to short-circuit a signal transmitted to a low noise amplifier (LNA) input end to ground. A resistor Rs or Rp connected to a gate of each transistor is a gate isolation resistor, which is configured to reduce a leakage current of the gate.

In a Global System for Mobile Communication (GSM) application, for a low frequency signal in the case of match, a maximum amplitude of an input signal can reach 20 volts (V); however, in a case of mismatch, the voltage amplitude can reach 40 V. As a result, reliability of a transistor device in a branch in an off state is seriously affected due to a limited breakdown voltage $V_{breakdown}$ of a transistor.

To solve a reliability problem of the transistor device, a stack manner is generally used in the prior art, that is, multiple transistors are stacked or cascaded. As shown in FIG. 2-1 and FIG. 2-2, FIG. 2-1 is a schematic principle diagram showing that reliability of a transistor device in a turned-off branch is improved in a stack manner; and FIG. 2-2 is a schematic diagram showing unbalanced voltage distribution caused by a current leakage from a gate to a body of a transistor in a stack manner. As shown in FIG. 2-1, when a transistor at an antenna transmit end, for example, M1 in FIG. 1, is in an on state ON, a sine voltage $v_{TX}$ is input, and in this case, n stacked transistors in a branch at a receive end are in an off state, for example, for M2 in FIG. 1 implemented by stacking n transistors, in an ideal case, a voltage of $v_{TX}/n$ is evenly borne between a source and a drain of each of the n stacked transistors, thereby reducing a voltage distributed to each transistor, and further facilitating improvement of transistor reliability. Each transistor in an off state may be equivalent to two parasitic capacitors $C_{gs}$ and $C_{gd}$ being in series connection, and therefore, it is equivalent that $C_{gs}$ or $C_{gd}$ of each transistor bears a distributed voltage of $v_{TX}/2n$. However, due to an actual problem of a manufacturing process of a transistor, a current leakage may exist at a gate and a body thereof, and current leakages at gates and bodies of all transistors are uneven, which causes that voltage distribution among the n stacked transistors is uneven. In this case, even if a value of n is properly selected according to $v_{TX}/2n<V_{breakdown}$, the reliability is still affected. In FIG. 2-2, Ig is a gate current, and Isub is a body current. Due to existence of Ig and Isub, from a transistor close to the antenna, source-drain currents $Id_1$ to $Id_n$ of the transistors are different. To solve a problem that uneven voltage distribution among the stacked transistors causes poor transistor reliability, a solution is provided in the prior art. As shown in FIG. 3, FIG. 3 is a schematic diagram of a circuit in which voltage distribution is balanced in the prior art. In FIG. 3, a gate of each of the stacked transistors (M1 to MN) is connected to a high-resistance resistor Rg, and the other end of the resistor is short-circuited to a common point G. In addition, a substrate, referred to as a body, of each transistor, is connected to a high-resistance resistor Rb, and the other end of the resistor is short-circuited to a common point B. To overcome the problem that uneven voltage distribution among the transistors cause poor transistor reliability, as shown in FIG. 3, in the prior art, a coupling capacitor (Cgg1 to Cgg(N-1)) or a coupling resistor (Rgg1 to Rgg(N-1)) or a network (Cgg1 Rgg1 to Cgg(N-1) Rgg(N-1)) in which a capacitor is connected in series with a resistor is added between gates of each of the stacked transistors, or a coupled circuit is added between a main signal path (a path formed by cascading M1 to MN) and a bias circuit (a path formed by cascading Rgs or a path formed by cascading Rbs), where the coupled circuit may be implemented by using a single coupling capacitor, for example, Cfwd, or may be implemented by using a circuit in which a capacitor is connected in series with a resistor, for example, Cfwd and Rfwd.

To solve the reliability problem of the transistor device, another solution is also provided in the prior art. As shown in FIG. 4, FIG. 4 is a schematic diagram of another circuit in which voltage distribution is balanced in the prior art. Because in the a case of a large signal voltage swing, some transistors in a branch in an off state are probably conducted, for example, transistors M1 to M3 shown in (a) and transistors M1 to M2 shown in (b) in FIG. 4. In this way, a large signal swing is distributed to another transistor that is turned off, for example, a transistor M4 shown in (a) and transistors M3 to M4 shown in (b) in FIG. 4. Because the total number of transistors to which the voltages are evenly distributed is reduced, a voltage borne by the turned-off transistor M4 or the turned-off transistors M3 to M4 increases, which causes the reliability problem. Therefore, in solution (a) shown in FIG. 4, a body B1 (B2, B3) and a source S1 (S2, S3) of the transistors M1 to M3 which are close to an antenna end in a branch in an off state are short-circuited, and in solution (b) shown in FIG. 4, a body B1 (B2) and a source S1 (S2) of the transistors M1 to M2 close to an antenna end in a branch in an off state are short-circuited, so that in a negative half cycle of the large signal voltage swing, a junction diode between a body and a source of each of the stacked transistors is not conducted, and more transistors are made to share the voltage; however, a connection between a source and a body introduces an extra signal path to a main signal path.

However, in the foregoing solutions in the prior art, an extra passive device, such as a coupling capacitor or a resistor, needs to be added, or an extra signal path is introduced to a main signal path, which not only causes an increase of costs, but more importantly, causes the foregoing coupling device and signal path tend to provide an extra transmission path for a signal to be transmitted, thereby causing a signal leakage, which results in performance deterioration such as an insertion loss of a switch.

SUMMARY

For the problems existing in the prior art, the present invention provides a radio frequency antenna switch, which is used to improve reliability of a transistor device and reduce a cost increase or performance deterioration.

A first aspect of the present invention provides a radio frequency antenna switch, including an antenna port configured to receive or transmit a radio frequency signal; a radio frequency signal port configured to receive the radio frequency signal from the antenna port or send the radio frequency signal to the antenna port; and at least one branch connected to the antenna port or the radio frequency signal port, where each branch in the at least one branch includes multiple transistors, the multiple transistors are connected in a stack manner, and each branch selectively couples or decouples the antenna port with the radio frequency signal port under the action of a control signal, where channel width to length ratios of a preset number of transistors in the multiple transistors progressively decrease in a direction away from the antenna port, where the preset number is less than or equal to the total number of the multiple transistors.

In a first possible implementation manner of the first aspect, when the preset number is less than the total number of the multiple transistors, at least one other transistor except the preset number of transistors in the multiple transistors and a transistor that is in the multiple transistors and is the farthest away from the antenna port have same channel width to length ratios.

According to the first aspect or the first possible implementation manner of the first aspect, in a second possible implementation manner of the first aspect, a gate of each transistor in the multiple transistors is connected to a gate resistor corresponding to the gate, and a body of each transistor is connected to a body resistor corresponding to the body; and resistance values of the gate resistors and the body resistors that correspond to the preset number of transistors in the multiple transistors progressively decrease in a direction away from the antenna port.

According to the first aspect, or the first or the second possible implementation manner of the first aspect, in a third possible implementation manner of the first aspect, a decreasing degree of the channel width to length ratios of the preset number of transistors increases with an increase in the number of the at least one branch.

A second aspect of the present invention provides a radio frequency antenna switch, including an antenna port configured to receive or transmit a radio frequency signal; a radio frequency signal port configured to receive the radio frequency signal from the antenna port or send the radio frequency signal to the antenna port; and at least one branch connected to the antenna port or the radio frequency signal port, where each branch in the at least one branch includes multiple transistors, the multiple transistors are connected in a stack manner, and each branch selectively couples or decouples the antenna port with the radio frequency signal port under the action of a control signal, where metal wires that do not affect an electrical connection relationship among the transistors separately cover a preset number of transistors in the multiple transistors, coverage areas of the metal wires progressively decrease in a direction away from the antenna port, and the preset number is less than or equal to the total number of the multiple transistors.

In a first possible implementation manner of the second aspect, each metal wire covers a gate or at least one of the following electrodes of a transistor corresponding to the metal wire: a source and a drain.

According to the second aspect or the first possible implementation manner of the second aspect, in a second possible implementation manner of the second aspect, when the preset number is less than the total number of the multiple transistors, metal wires with same coverage areas are disposed above at least one other transistor except the preset number of transistors in the multiple transistors and a transistor that is in the multiple transistors and is the farthest away from the antenna port, or the no metal wires cover the at least one other transistor except the preset number of transistors in the multiple transistors.

According to the second aspect, or the first or the second possible implementation manner of the second aspect, in a third possible implementation manner of the second aspect, a gate of each transistor in the multiple transistors is connected to a gate resistor corresponding to the gate, and a body of each transistor is connected to a body resistor corresponding to the body; and resistance values of the gate resistors and the body resistors that correspond to the preset number of transistors progressively decrease in a direction away from the antenna port.

According to the second aspect, or the first, the second, or the third possible implementation manner of the second aspect, in a fourth possible implementation manner of the second aspect, a decreasing degree of the coverage areas of the metal wires increases with an increase in the number of the at least one branch.

A third aspect of the present invention provides a radio frequency antenna switch, including an antenna port configured to receive or transmit a radio frequency signal; a radio frequency signal port configured to receive the radio frequency signal from the antenna port or send the radio frequency signal to the antenna port; and at least one branch connected to the antenna port or the radio frequency signal port, where each branch in the at least one branch includes multiple transistors, the multiple transistors are connected in a stack manner, and each branch selectively couples or decouples the antenna port with the radio frequency signal port under the action of a control signal, where each transistor in the multiple transistors has a multi-finger structure, including at least one first finger used as a source and at least one second finger used as a drain, where each first finger is connected to a common source point, and each second finger is connected to a common drain point; each first finger is connected, by using multiple first vias, to a source corresponding to the first finger, and each second finger is connected, by using multiple second vias, to a drain corresponding to the second finger; and the numbers of the first vias and the second vias of a preset number of transistors in the multiple transistors progressively decrease in a direction away from the antenna port, where the preset number is less than or equal to the total number of the multiple transistors.

In a first possible implementation manner of the third aspect, when the preset number is less than the total number of the multiple transistors, at least one other transistor except the preset number of transistors in the multiple transistors and a transistor that is in the multiple transistors and is the farthest away from the antenna port have a same number of the first vias and a same number of the second vias.

According to the third aspect or the first possible implementation manner of the third aspect, in a second possible implementation manner of the third aspect, a gate of each transistor in the multiple transistors is connected to a gate resistor corresponding to the gate, and a body of each transistor is connected to a body resistor corresponding to the body; and resistance values of the gate resistors and the body resistors that correspond to the preset number of transistors progressively decrease in a direction away from the antenna port.

According to the third aspect, or the first or the second possible implementation manner of the third aspect, in a third possible implementation manner of the third aspect, decreasing degrees of the numbers of the first vias and the second vias of the preset number of transistors increase with an increase in the number of the at least one branch.

The radio frequency antenna switch provided in the present invention includes at least one branch formed by multiple transistors in a stack manner, where each branch has a preset number of transistors, and channel width to length ratios of these transistors progressively decrease in a direction away from the antenna end. With the radio frequency antenna switch, capacitances of the preset number of transistors close to an antenna port increase, and distributed voltages that these transistors close to the antenna end in an off state need to bear are reduced, so that voltages are evenly distributed to the transistors in each branch, thereby improving reliability of a transistor device.

BRIEF DESCRIPTION OF DRAWINGS

FIG. 2-1 is a schematic principle diagram showing that reliability of a transistor device in a turned-off branch is improved in a stack manner;

FIG. 2-2 is a schematic diagram showing uneven voltage distribution caused by a current leakage from a gate to a body of a transistor in a stack manner;

FIG. 5-1 is a schematic structural diagram of a radio frequency antenna switch according to a first embodiment of the present invention;

FIG. 5-2 is a schematic structural diagram of an equivalent model of a branch 1 in the radio frequency antenna switch provided in FIG. 5-1;

FIG. 5-3 is a schematic layout diagram of the branch 1 in the radio frequency antenna switch provided in FIG. 5-1;

DESCRIPTION OF EMBODIMENTS

Figure 1:
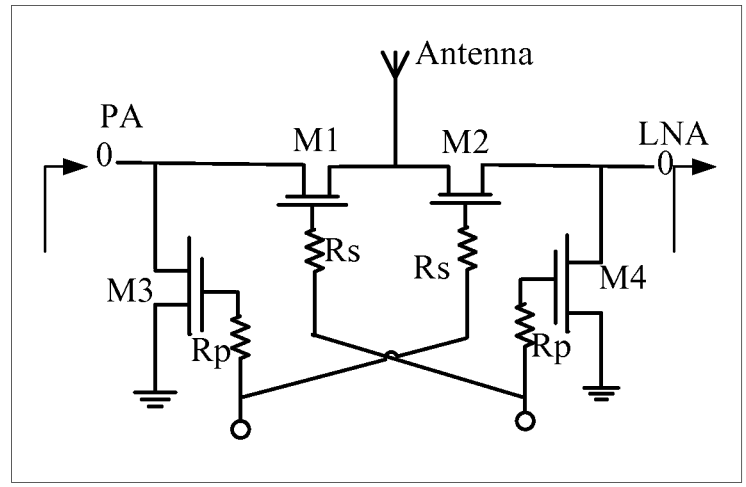
FIG. 1 is a schematic diagram of a basic structure of an SPDT radio frequency antenna switch.
Figures 1, 5:
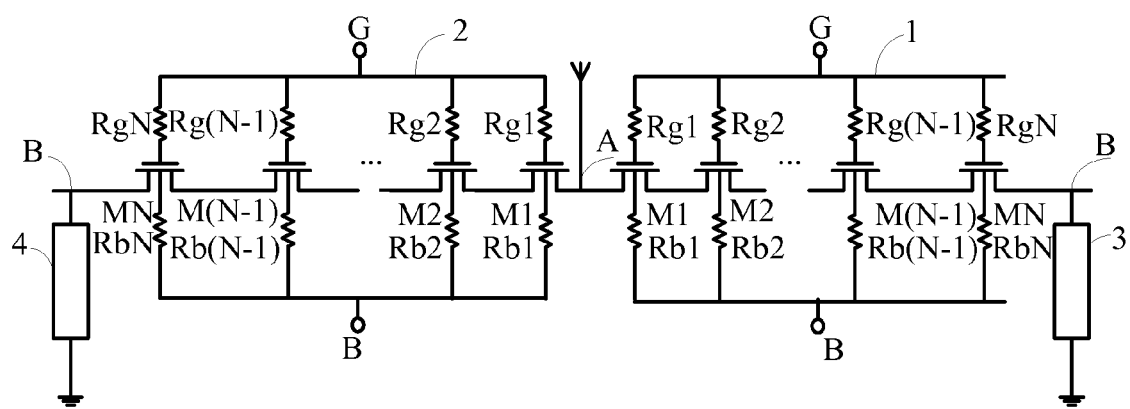
Figures 2, 5:
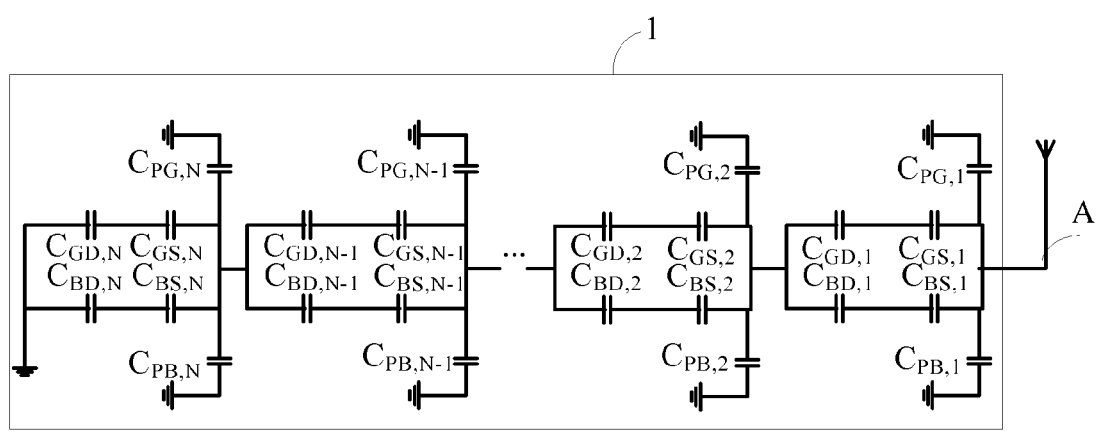
Figures 3, 5:
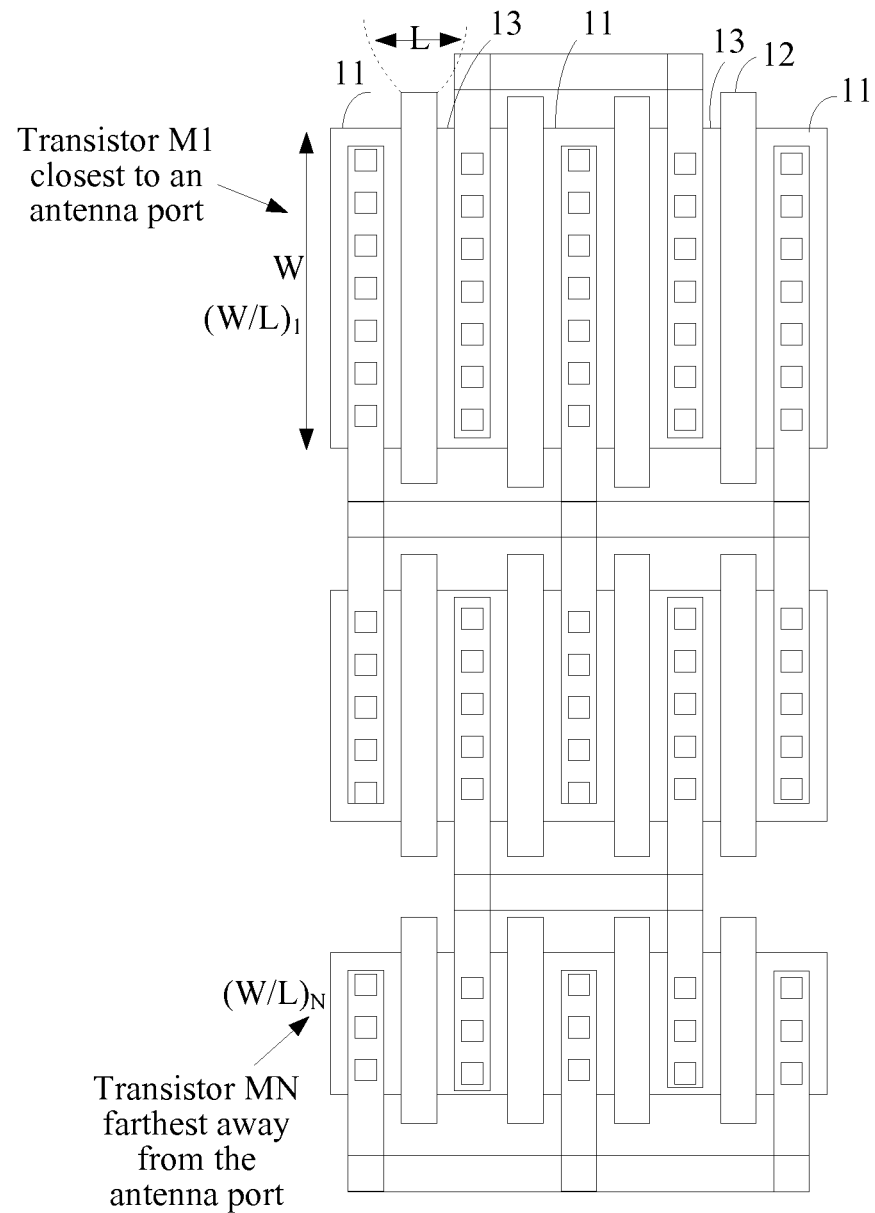

FIG. 5-1 is a schematic structural diagram of a radio frequency antenna switch according to a first embodiment of the present invention. As shown in FIG. 5-1, the radio frequency antenna switch in this embodiment includes an antenna A and at least one branch that is connected in series with or in parallel with the antenna A. Generally, according to an actual application situation, for example, the number of frequency bands supported by a terminal, the radio frequency antenna switch may include multiple branches. A description is provided below by only using an example in which the radio frequency antenna switch is an SPDT switch, and a principle of another switch, such as a single-pole five-throw (SP5T) switch, a single-pole eight-throw (SP8T) switch, or a single-pole twelve-throw (SP12T) switch, is similar to that of the SPDT switch.

The SPDT radio frequency antenna switch in this embodiment includes an antenna port A which is configured to receive or transmit a radio frequency signal, a radio frequency signal port B which is configured to receive the radio frequency signal from the antenna port A or send the radio frequency signal to the antenna port A, a series branch 1 and a series branch 2 that are connected to the antenna port A, and a parallel branch 3 and a parallel branch 4 that are connected to the radio frequency signal port B. If the branch 1 is a branch at a transmit end, the branch 1 may be connected to, for example, an output end of a PA located at the transmit end, so as to transmit a signal obtained from the PA to the antenna port A by using the series branch 1, and then send the signal by using an antenna at the antenna port A. In this case, the branch 2 may be a branch at a receive end, and the branch 2 may be connected to, for example, an input end of an LNA located at the receive end. When the branch 1 is in an on state, that is, when the radio frequency antenna switch is configured to send a data signal, the branch 2 should be in an off state. In addition, the branch 3 is connected in parallel with the branch 1, and a function of the branch 3 is, for example, as follows, when the branch 1 is in an off state, that is, when the radio frequency antenna switch is configured to receive a data signal, the branch 3 is configured to short-circuit a signal at the transmit end to ground. Similarly, the branch 4 is also used to shunt a signal.

In this embodiment, as described above, the radio frequency antenna switch may include multiple branches, where each branch may include multiple transistors, and these transistors are connected in a stack manner. A circuit structure of the multiple transistors stacked in each branch is described below by only using the branch 1 as an example. As shown in FIG. 5-1, circuit structures of other branches, for example, the branch 2 to the branch 4, are similar to a circuit structure of the branch 1, which are not described repeatedly.

As shown in FIG. 5-1, the branch 1 includes N transistors that are connected in a stack manner: M1, M2, . . . , MN. Optionally, a gate of each transistor is connected to a gate resistor, and a body of each transistor is connected to a body resistor. For example, a gate of M1 is connected to a gate resistor Rg1, and a body of M1 is connected to a body resistor Rb1; a gate of M2 is connected to a gate resistor Rg2, and a body of M2 is connected to a body resistor Rb2; a gate of MN is connected to a gate resistor RgN, and a body of MN is connected to a body resistor RbN; and each gate resistor is connected to a gate resistor common point G, and each body resistor is connected to a body resistor common point B. Structures of other branches, for example, the branch 2 to the branch 4, are similar to the structure of the branch 1, and the branch 2 is shown in FIG. 5-1.

Generally, when a branch is in an off state, a large voltage swing in a case of mismatch introduced in BACKGROUND greatly affects reliability of each transistor device in the branch in an off state. In addition, because current leakages of gates and bodies of all transistors in the branch in an off state are different, generally, an impact of the large voltage swing on a transistor closer to an antenna port A is greater, for example, an impact on transistors M1 to ML closer to the antenna port A is greater than an impact on transistors M(L+1) to MN.

Figures 1, 2:
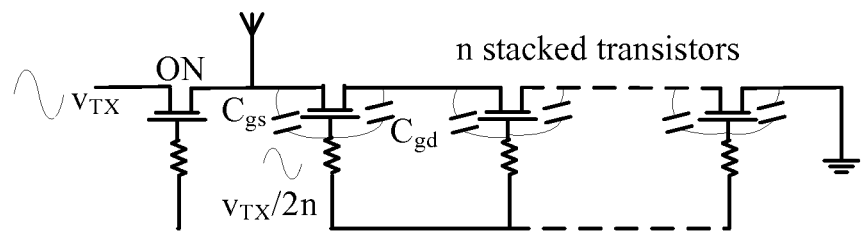
Figure 2:
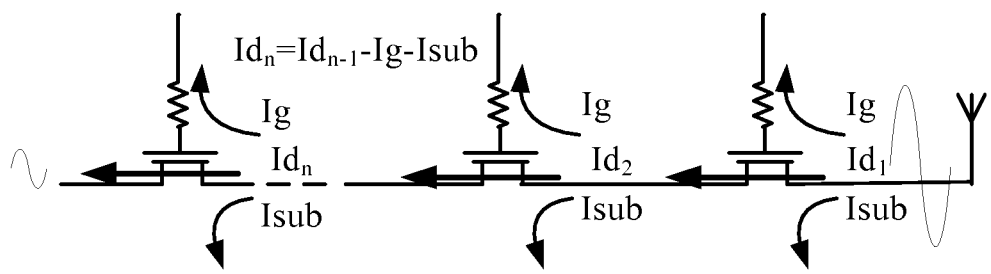

In addition, voltage distribution of the large voltage swing on each transistor in the branch in an off state is based on capacitors. As shown in FIG. 5-2, FIG. 5-2 is a schematic structural diagram of an equivalent model of a branch 1 in the radio frequency antenna switch provided in FIG. 5-1. When the branch 1 is in an off state, the branch 2 short-circuits a signal to the ground. It is assumed that a gate resistor and a body resistor of each transistor in the branch 1 are high enough in resistance, and in this case, a gate and a body of each transistor may be deemed as being open-circuited. In this case, the equivalent model of the branch 1 is shown in FIG. 5-2. In the figure, $C_{BD}$ is a body-drain parasitic capacitor, $C_{BS}$ is a body-source parasitic capacitor, $C_{GD}$ is a gate-drain parasitic capacitor, $C_{GS}$ is a gate-source parasitic capacitor, and $C_{PB}$ and $C_{PG}$ respectively represents a parasitic capacitor of the body and a parasitic capacitor of the gate. In an ideal case, $C_{PB}$ and $C_{PG}$ do not exist, and $C_{BD}$, $C_{BS}$, $C_{GD}$, and $C_{GS}$ bear distributed voltages.

In this embodiment, in order to prevent a large voltage swing from harming the reliability of transistors in a branch in an off state due to uneven voltage distribution among the transistors, this embodiment uses the following manner.

According to a principle of voltage distribution by using a capacitor, in order to reduce a more serious impact of the large voltage swing on the transistor close to the antenna port A, a capacitance of the transistor close to the antenna port A needs to be made higher, and a capacitance of a transistor far away from the antenna port A is lower, that is, $C_{BD,1}$, $C_{BS,1}$, $C_{GD,1}$, and $C_{GS,1}$ should be the highest, while $C_{BD,N}$, $C_{BS,N}$, $C_{GD,N}$, and $C_{BS,N}$ should be the lowest. Therefore, channel width to length ratios of a preset number of transistors in all the transistors in the branch 1 may be enabled to progressively decrease in a direction away from the antenna, where the preset number is less than or equal to the number of the multiple transistors.

Figure 3:
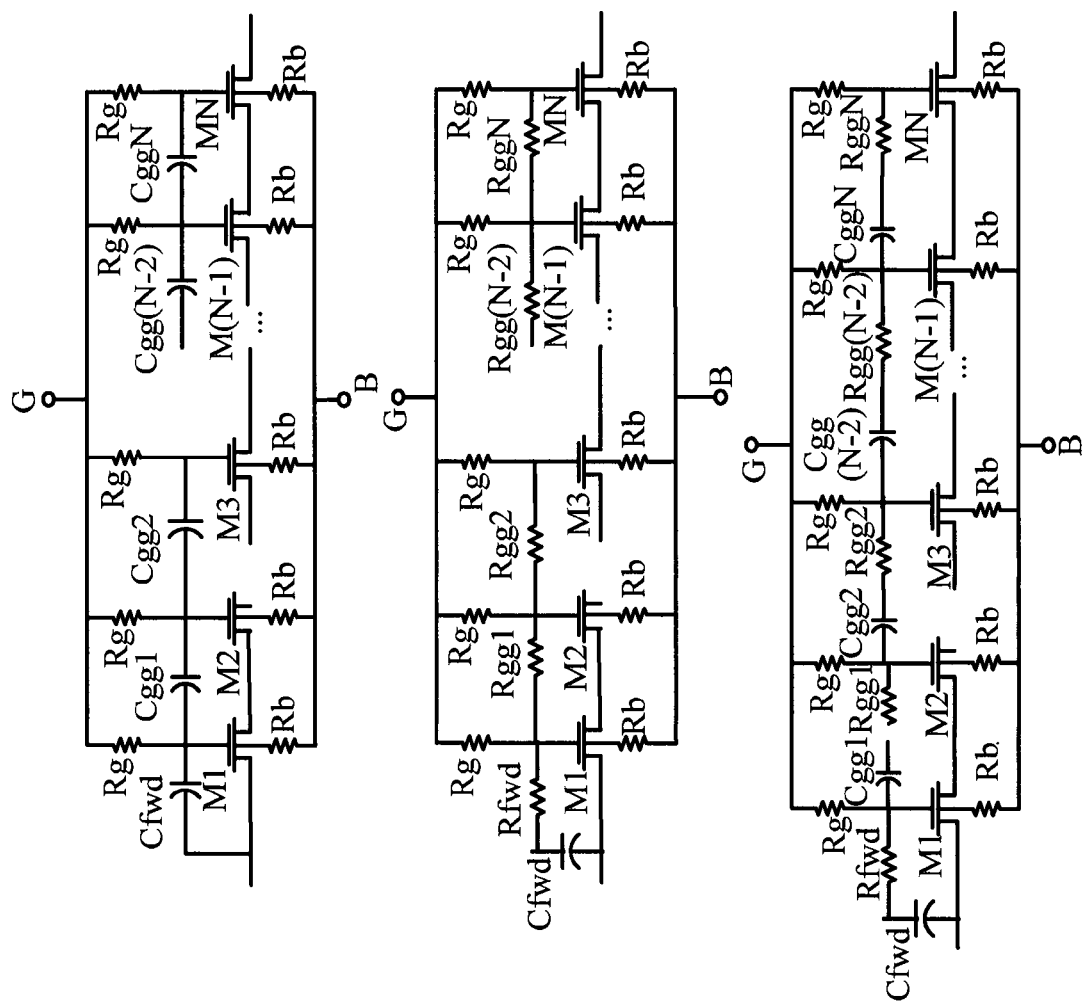
FIG. 3 is a schematic diagram of a circuit in which voltage distribution is balanced in the prior art.
Figure 4:
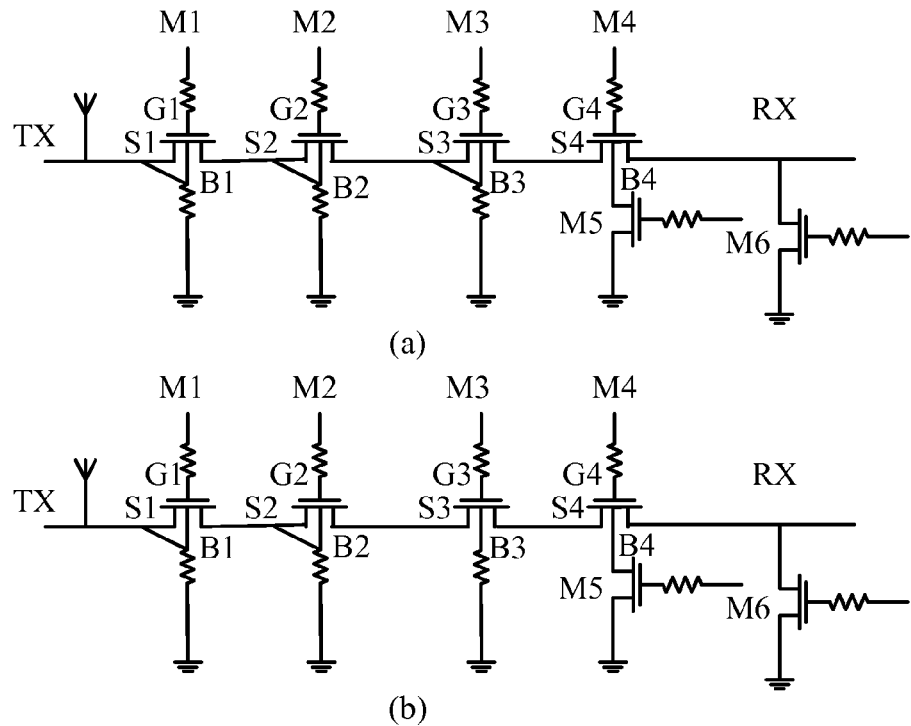
FIG. 4 is a schematic diagram of another circuit in which voltage distribution is balanced in the prior art.

For example, as shown in FIG. 5-3, FIG. 5-3 is a schematic layout diagram of the branch 1 in the radio frequency antenna switch provided in FIG. 5-1. For example, channel width to length ratios of all the transistors in the branch 1 are enabled to progressively decrease in a direction away from the antenna, that is, $(W/L)_1 > (W/L)_2 > \ldots > (W/L)_{N-1} > (W/L)_n$, where $(W/L)_1$ is a channel width to length ratio of the transistor M1 closest to the antenna port A, the rest may be deduced by analogy, and $(W/L)_N$ is a channel width to length ratio of the transistor MN farthest away from the antenna port A. In FIG. 5-3, 11 is a source of the transistor M1, 12 is a gate of the transistor M1, and 13 is a drain of the transistor M1. In addition, FIG. 5-3 only illustrates a case in which it is ensured that lengths of the transistors remain unchanged while widths progressively decrease. It can be understood that, the widths of the transistors may be enabled to remain unchanged while the lengths may be enabled to increase progressively, so that it is implemented that width to length ratios progressively decrease in a direction away from the antenna.

In this embodiment, each branch included in the radio frequency antenna switch and formed by multiple transistors in a stack manner has a preset number of transistors, and channel width to length ratios of these transistors progressively decrease in a direction away from the antenna, so that capacitances of multiple transistors close to the antenna port increase, and distributed voltages that these transistors close to the antenna end need to bear are reduced; in this way, voltages can be evenly distributed to the transistors in each branch by properly selecting a channel width to length ratio for each transistor, thereby greatly improving reliability of a transistor device. In addition, by means of adjustment of the channel width to length ratio, an equivalent resistance of a branch can be reduced when the branch is in an on state, thereby further improving an insertion loss of the branch.

Figure 6:
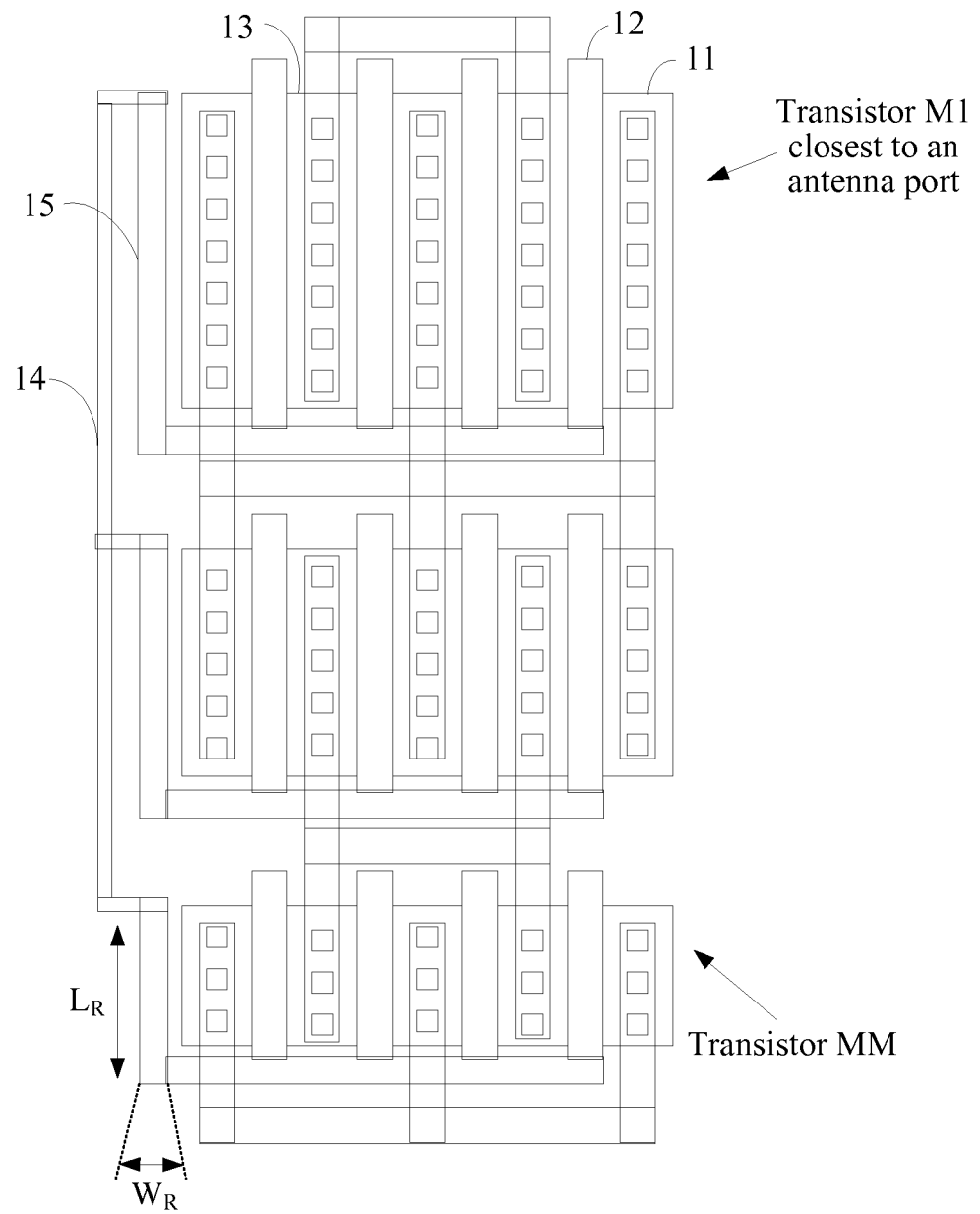
FIG. 6 is a schematic layout diagram of a radio frequency antenna switch according to a second embodiment of the present invention.

Further, based on the embodiment shown in FIG. 5-1, FIG. 6 is a schematic layout diagram of a radio frequency antenna switch according to a second embodiment of the present invention. As shown in FIG. 6, based on the foregoing embodiment, a description is provided still by using a branch 1 as an example. If the preset number of transistors, in the branch 1, whose channel width to length ratios progressively decrease in a direction away from the antenna port A is less than the total number of transistors included in the branch 1, at least one other transistor except the preset number of transistors in the branch 1 has a same channel width to length ratio. The at least one other transistor except the preset number of transistors in the branch 1 has a channel width to length ratio equal to a channel width to length ratio of a transistor farthest away from the antenna port A, that is:

$$(W/L)_1 > (W/L)_2 > \ldots > (W/L)_M, (W/L)_M = (W/L)_{M+1} = \ldots = (W/L)_N, (1 < M \le N).$$

In FIG. 6, channel width to length ratios of transistors M1 to MM that are in the branch 1 and close to the antenna port A progressively decrease in a direction away from the antenna port A, while channel width to length ratios of transistors MM to MN in the branch 1 are the same, and are equal to the channel width to length ratio of the transistor MN farthest away from the antenna port A. It can be understood that the channel width to length ratio of the at least one other transistor may also be any numerical value less than a minimum channel width to length ratio in the progressively decreasing channel width to length ratios of the transistors.

In this case, in this embodiment, resistance values of gate resistors and body resistors that correspond to the preset number of transistors in the branch 1 also progressively decrease in a direction away from the antenna port A. In addition, at least one other transistor except the preset number of transistors has gate resistors with same resistance values and body resistors with same resistance values, where the resistance values of the gate resistors with same resistance values are equal to a resistance value of a gate resistor of the transistor that is in the multiple transistors and farthest away from the antenna port A, and the resistance values of the body resistors with same resistance values are equal to a resistance value of a body resistor of the transistor that is in the multiple transistors and farthest away from the antenna port A.

In other words, resistance values of gate resistors and body resistors of some transistors whose channel width to length ratios progressively decrease also progressively decrease; resistance values of gate resistors of remaining other transistors are the same, and preferably, are equal to the resistance value of the gate resistor and the body resistor of the transistor farthest away from the antenna port A. In addition, resistance values of body resistors of at least one other transistor that are remaining are the same, and preferably, are equal to the resistance value of the body resistor of the transistor farthest away from the antenna port A, that is:

$$R_{g1} > R_{g2} > \ldots > R_{gM}, R_{gM} = R_{g(M+1)} = \ldots = R_{gN} \times (1 < M \leq N),$$

$$R_{b1} > R_{b2} > \ldots > R_{bM}, R_{bM} = R_{b(M+1)} = \ldots = R_{bN} \times (1 < M \leq N).$$

As shown in FIG. 6, FIG. 6 only illustrates a decreasing variation trend of gate resistors, and in a case in which types of gate resistors 15 are the same, and widths $W_R$ of the gate resistors are the same, a lengths $L_R$ of the gate resistor of the transistor close to the antenna end is relatively great, so that a resistance value of the resistor is relatively great. During implementation, an objective of a progressive decrease in resistance values may also be achieved by changing types of the resistors, or width to length ratios of the resistors, or the number of resistors connected in series, or the number of resistors connected in parallel. However, it can be understood that a manner in which resistance values of body resistors progressively decrease is similar to a manner in which resistance values of gate resistors progressively decrease, which is not described repeatedly. In FIG. 6, 14 represents a gate resistor common point G.

In this embodiment, channel width to length ratios, resistance values of gate resistors, and resistance values of substrate body resistors of all transistors in each branch are enabled to maintain the foregoing consistent changing trend, so that not only reliability of each transistor in the branch is improved, but also linearity performance of the branch, such as intermodulation performance or harmonic performance is well improved.

Further, a description is provided in the foregoing embodiment by only using the SPDT switch as an example. In an actual application, switches that have more branches, such as an SP5T switch, an SP8T switch, and an SP12T switch may probably be involved. It should be noted that a decreasing degree of the channel width to length ratios of the preset number of transistors increases with an increase in the number of the at least one branch, that is, compared with a radio frequency antenna switch having a smaller number of branches, for a radio frequency antenna switch having a greater number of branches has a greater decreasing degree of channel width to length ratios of adjacent transistors. For example, $(W/L)_1 - (W/L)_2$ in the SP5T switch is greater than $(W/L)_1 - (W/L)_2$ in the SPDT switch, and the rest may be deduced by analogy.

Figure 7:
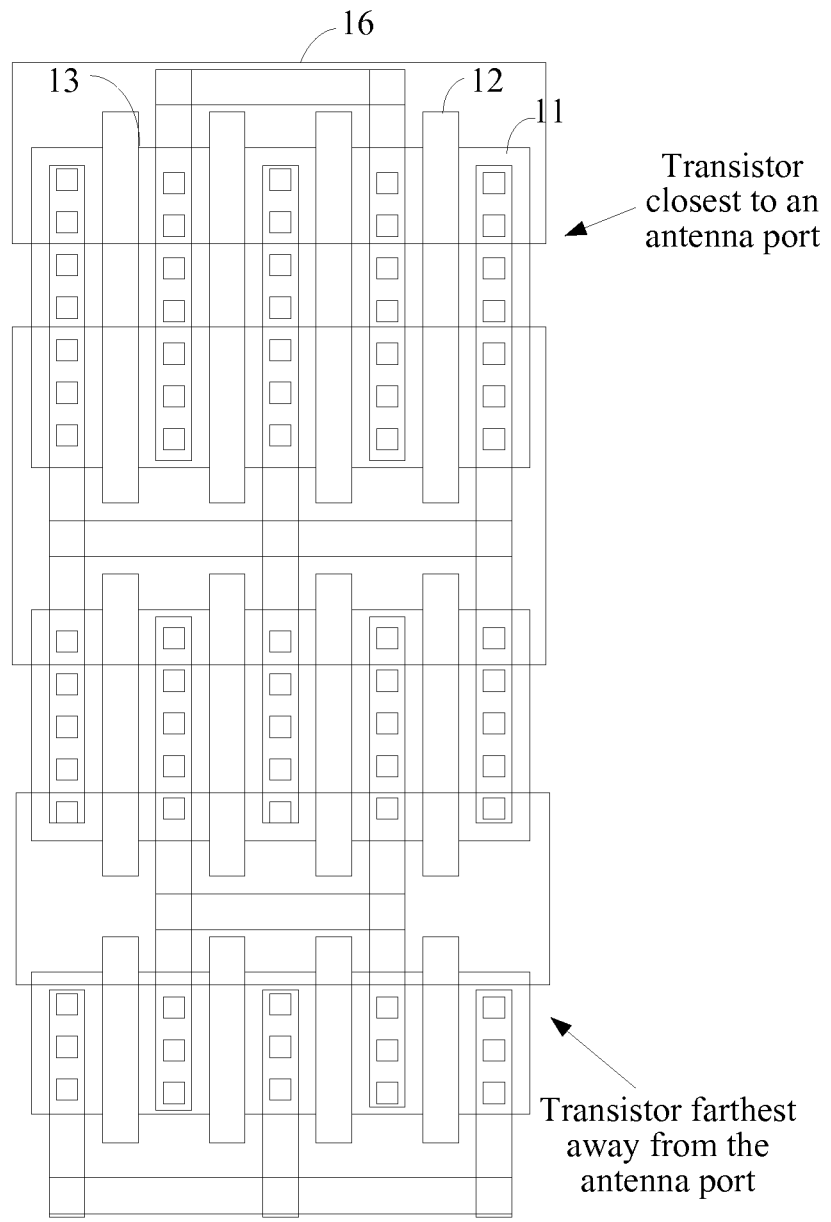
FIG. 7 is a schematic layout diagram of a radio frequency antenna switch according to a third embodiment of the present invention.

FIG. 7 is a schematic layout diagram of a radio frequency antenna switch according to a third embodiment of the present invention. The radio frequency antenna switch provided in this embodiment includes an antenna port configured to receive or transmit a radio frequency signal; a radio frequency signal port configured to receive the radio frequency signal from the antenna port or send the radio frequency signal to the antenna port; and at least one branch connected to the antenna port or the radio frequency signal port, where each branch in the at least one branch includes multiple transistors, the multiple transistors are connected in a stack manner, and each branch selectively couples or decouples the antenna port with the radio frequency signal port under the action of a control signal, where metal wires 16 that do not affect an electrical connection relationship among the transistors separately cover a preset number of transistors in the multiple transistors, coverage areas of the metal wires 16 progressively decrease in a direction away from the antenna port, and the preset number is less than or equal to the total number of the multiple transistors.

This embodiment solves, by means of layout optimization, a problem of poor reliability of a transistor caused by uneven distribution of a large voltage swing among all transistors in each branch in a radio frequency antenna switch. As shown in FIG. 7, on the basis of not affecting an electrical connection relationship among all transistors that are connected in a stack manner, a layer of metal wires 16 may separately cover all or some transistors in each branch, coverage areas of the metal wires 16 above the transistors progressively decrease in a direction in which the transistors are away from the antenna port, and the metal wires 16 above each transistor may cover a gate and at least one of the following electrodes (a source and a drain) of the transistor. FIG. 7 shows a case in which a layer of metal wires 16 that do not affect an electrical connection relationship covers all transistors in a branch, and the metal wires 16 cover a source, a drain, and a gate of a corresponding transistor. As can be seen from the figure, from a transistor closest to the antenna port to a transistor farthest away from the antenna port, coverage areas of the metal wires 16 progressively decrease.

Further, if the preset number of the transistors on which the coverage areas of the metal wires 16 progressively decrease in a direction away from the antenna port is less than the total number of transistors included in a current branch, metal wires 16 covering at least one other transistor except the preset number of transistors in the branch have same coverage areas. Optionally, metal wires with same coverage areas are disposed above the at least one other transistor and a transistor that is in the multiple transistors and is the farthest away from the antenna port.

Further, if the preset number of the transistors on which the coverage areas of the metal wires 16 progressively decrease in a direction away from an antenna is less than the total number of transistors included in the current branch, the at least one other transistor except the preset number of transistors in the branch may not increase extra metal coverage.

Further, a gate of each transistor in the multiple transistors is connected to a gate resistor corresponding to the gate, a body of each transistor is connected to a body resistor corresponding to the body, and resistance values of the gate resistors and the body resistors that correspond to the preset number of transistors progressively decrease in a direction away from the antenna port.

Further, a decreasing degree of the coverage areas of the metal wires increases with an increase in the number of the at least one branch.

In this embodiment, metal wires that do not affect an electrical connection are added on a surface of each transistor, which may increase a parasitic capacitance of the transistor. Voltage swing distribution of a branch in an off state is performed according to a capacitor, and coverage areas of the metal wires gradually decrease in a direction away from an antenna port, so that a parasitic capacitance of a transistor close to the antenna port is increased, and an objective of balancing voltage distribution can further be achieved, thereby facilitating improvement of transistor reliability.

Figure 8:
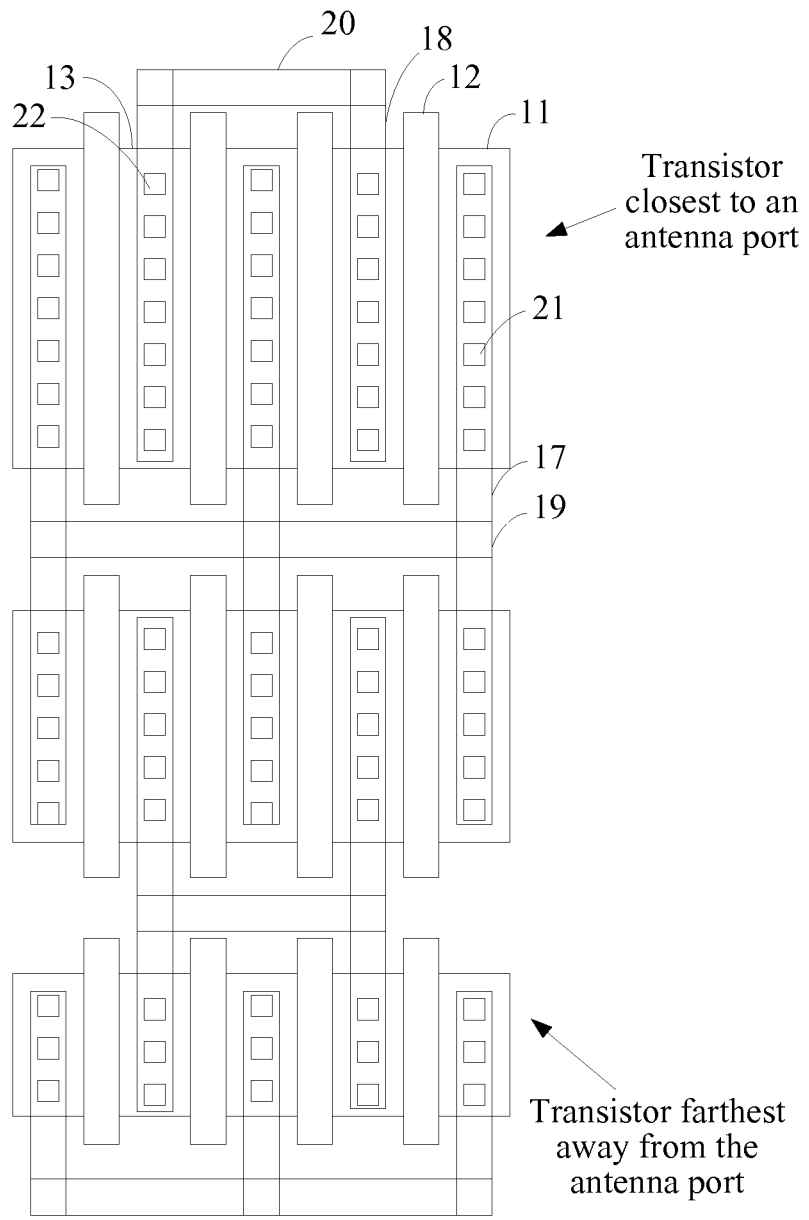
FIG. 8 is a schematic layout diagram of a radio frequency antenna switch according to a fourth embodiment of the present invention.

FIG. 8 is a schematic layout diagram of a radio frequency antenna switch according to a fourth embodiment of the present invention. The radio frequency antenna switch provided in this embodiment includes an antenna port configured to receive or transmit a radio frequency signal; a radio frequency signal port configured to receive the radio frequency signal from the antenna port or send the radio frequency signal to the antenna port; and at least one branch connected to the antenna port or the radio frequency signal port, where each branch in the at least one branch includes multiple transistors, the multiple transistors are connected in a stack manner, and each branch selectively couples or decouples the antenna port with the radio frequency signal port under the action of a control signal, where each transistor in the multiple transistors has a multi-finger structure, including first fingers 17 used as sources 11 and second fingers 18 used as drains 13, where each first finger 17 is connected to a common source point 19, and each second finger 18 is connected to a common drain point 20; each first finger 17 is connected, by using multiple first vias 21, to a source 11 corresponding to the first finger 17, and each second finger 18 is connected, by using multiple second vias 22, to a drain 13 corresponding to the second finger 18; and the numbers of the first vias 21 and the second vias 22 of a preset number of transistors in the multiple transistors progressively decrease in a direction away from the antenna port, where the preset number is less than or equal to the total number of the multiple transistors.

This embodiment solves, by means of layout optimization, a problem of poor reliability of a transistor caused by unbalanced distribution of a large voltage swing among all transistors in each branch in a radio frequency antenna switch. As shown in FIG. 8, each transistor generally includes a cascaded structure of multiple groups of sources 11, gates 12, and drains 13. In this embodiment, in terms of a manufacturing process, each transistor is of a multi-finger structure, that is, each transistor includes multiple first fingers 17 and second fingers 18 that are respectively and alternately connected to sources and drains, so that the sources are connected by using multiple first vias 21 on each first finger 17, and the drains are connected by using multiple second vias 22 on each second finger 18. One end of each first finger 17 of each transistor is connected to a common source point 19, and one end of each second finger 18 of each transistor is connected to a common drain point 20. In addition, for a transistor, generally, each punched first via 21 needs to be punched to a metal layer, so as to connect all first fingers 17 together by means of an electrical connection feature of the metal layer. The situation of the second fingers is the same.

In this embodiment, objectives of evenly distributing voltages among the transistors and further improving transistor reliability can be achieved by changing the numbers of the first vias 21 and the second vias 22 of each transistor. That is, the numbers of the first vias 21 and the second vias 22 of a preset number of transistors in each branch progressively decrease in a direction away from the antenna port, where the preset number is less than or equal to the total number of the multiple transistors. As shown in FIG. 8, FIG. 8 shows a case in which the numbers of first vias 21 and second vias 22 of each transistor from a transistor closest to the antenna port to a transistor farthest away from the antenna port progressively decrease.

Further, if the preset number of the transistors of which first vias 21 and second vias 22 progressively decrease in number in a direction away from the antenna port is less than the total number of transistors included in a current branch, at least one other transistor except the preset number of transistors in the branch and a transistor that is in the multiple transistors and is the farthest away from the antenna port have a same number of the first vias 21 and a same number of the second vias 22. Generally, the number of first vias 21 may be equal to or may not be equal to the number of second vias 22, which is not limited in this embodiment.

Further, a gate of each transistor in the multiple transistors is connected to a gate resistor corresponding to the gate, a body of each transistor is connected to a body resistor corresponding to the body, and resistance values of the gate resistors and the body resistors that correspond to the preset number of transistors progressively decrease in a direction away from the antenna port.

Further, decreasing degrees of the numbers of the first vias and the second vias of the preset number of transistors increase with an increase in the number of the at least one branch.

In this embodiment, by increasing the numbers of first vias and second vias of a transistor close to an antenna end, an overlap capacitance between each finger corresponding to each source and each finger corresponding to each drain of the transistor can be increased, and further an objective of balancing voltage distribution can be achieved, which facilitates improvement of transistor reliability. In addition, that resistance values of gate resistors and body resistors progressively decrease are also beneficial to improving linear performance of the transistor.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

The invention claimed is:

1. A radio frequency antenna switch, comprising:
an antenna port configured to receive or transmit a radio frequency signal;
a radio frequency signal port configured to receive the radio frequency signal from the antenna port or send the radio frequency signal to the antenna port; and
at least one branch connected to the antenna port or the radio frequency signal port,
wherein each branch in the at least one branch comprises multiple transistors, the multiple transistors are connected in a stack manner, and each branch selectively couples or decouples the antenna port with the radio frequency signal port under the action of a control signal,
wherein channel width to length ratios of a preset number of transistors in the multiple transistors progressively decrease in a direction away from the antenna port, and
wherein the preset number is less than or equal to the total number of the multiple transistors.

2. The switch according to claim 1, wherein when the preset number is less than the total number of the multiple transistors, at least one other transistor except the preset number of transistors in the multiple transistors and a transistor that is in the multiple transistors and is the farthest away from the antenna port have same channel width to length ratios.

3. The switch according to claim 1, wherein a gate of each transistor in the multiple transistors is connected to a gate resistor corresponding to the gate, and a body of each transistor is connected to a body resistor corresponding to the body, and wherein resistance values of the gate resistors and the body resistors that correspond to the preset number of transistors progressively decrease in the direction away from the antenna port.

4. The switch according to claim 1, wherein a decreasing degree of the channel width to length ratios of the preset number of transistors increases with an increase of the number of the at least one branch.

* * * * *